United States Patent [19]

Sakamoto

[11] Patent Number: 4,631,696
[45] Date of Patent: Dec. 23, 1986

[54] FIXED-POINT DATA/FLOATING-POINT DATA CONVERTING APPARATUS

[75] Inventor: Tsutomu Sakamoto, Tokyo, Japan

[73] Assignee: Tokyo Shibaura Denki Kabushiki Kaisha, Kawasaki, Japan

[21] Appl. No.: 573,347

[22] Filed: Jan. 24, 1984

[30] Foreign Application Priority Data

Jan. 28, 1983 [JP] Japan ................... 58-12527

[51] Int. Cl.$^4$ ............................ G06F 7/38; G06F 5/00
[52] U.S. Cl. ...................................... 364/748; 364/715; 235/310
[58] Field of Search ................ 364/748, 200 MS File, 364/900 MS File; 235/310

[56] References Cited

U.S. PATENT DOCUMENTS

| | | | |
|---|---|---|---|
| 3,930,232 | 12/1975 | Wallach et al. | 364/200 |
| 3,961,170 | 6/1976 | De Sandre et al. | 364/900 |
| 4,038,538 | 7/1977 | Semmelhaack et al. | 235/310 |
| 4,189,715 | 2/1980 | Duttweiler | 340/347 DD |
| 4,475,173 | 10/1984 | Talmi | 364/900 |
| 4,511,990 | 4/1985 | Hagiwara et al. | 364/748 |
| 4,553,133 | 11/1985 | Peterson et al. | 367/74 |
| 4,559,620 | 12/1985 | Blair | 364/900 |

*Primary Examiner*—James D. Thomas
*Assistant Examiner*—Dale M. Shaw

*Attorney, Agent, or Firm*—Cushman, Darby & Cushman

[57] ABSTRACT

A fixed-point data/floating-point data converting apparatus has: a priority encoder with input terminals respectively receiving output signals from logic gates (first logic gates) for use in detecting whether or not all of the digits fixed-point data are "0", to obtain a number of continuous "zero" digits from the most significant digit of the fixed-point data, in accordance with the contents of the signals received thereby; a shifter for shifting the fixed-point data to the left by the number of digits of continuous "zero" digits, thereby obtaining a mantissa part; an adder for subtracting the number of continuous "zero" digits from a reference value, thereby obtaining an exponent part; and a data selector for generating the floating-point data in accordance with the subtraction results from the adder, the shift results from the shifter, all-zero data, and an output signal from the logic gate (first logic gate) for detecting whether or not all digits of the fixed-point data are "0", in response to the output signals from the logic gates (second logic gates). In this converting apparatus, the data selector selects the all-zero data, as floating-point data, when all of the digits of the fixed-point data are "0". Otherwise, the data selector selects, as floating-point data, data including the subtraction results supplied from the adder and the shift results supplied from the shifter.

11 Claims, 7 Drawing Figures

| INPUTS | | | | | | | | OUTPUTS | | |
|---|---|---|---|---|---|---|---|---|---|---|
| I0 | I1 | I2 | I3 | I4 | I5 | I6 | I7 | A2 | A1 | A0 |
| H | H | H | H | H | H | H | H | H | H | H |
| X | X | X | X | X | X | X | L | L | L | L |
| X | X | X | X | X | X | L | H | L | L | H |
| X | X | X | X | X | L | H | H | L | H | L |
| X | X | X | X | L | H | H | H | L | H | H |
| X | X | X | L | H | H | H | H | H | L | L |
| X | X | L | H | H | H | H | H | H | L | H |
| X | L | H | H | H | H | H | H | H | H | L |
| L | H | H | H | H | H | H | H | H | H | H |

| LZ | RESULTS OF SHIFTING | | | | | | | |
|---|---|---|---|---|---|---|---|---|
| | M | | | | | | | |
| 000 | D0 | D1 | D2 | D3 | D4 | D5 | D6 | D7 |
| 001 | D1 | D2 | D3 | D4 | D5 | D6 | D7 | 0 |
| 010 | D2 | D3 | D4 | D5 | D6 | D7 | 0 | 0 |
| 011 | D3 | D4 | D5 | D6 | D7 | 0 | 0 | 0 |
| 100 | D4 | D5 | D6 | D7 | 0 | 0 | 0 | 0 |
| 101 | D5 | D6 | D7 | 0 | 0 | 0 | 0 | 0 |
| 110 | D6 | D7 | 0 | 0 | 0 | 0 | 0 | 0 |
| 111 | D7 | 0 | 0 | 0 | 0 | 0 | 0 | 0 |

FIXED-POINT DATA/FLOATING-POINT DATA CONVERTING APPARATUS

BACKGROUND OF THE INVENTION

The present invention relates to a digital data processing apparatus for processing fixed-point data and floating-point data and, more particularly, to a fixed-point data/floating-point data converting apparatus.

Conventionally, conversion of this type is performed by a combination of microprograms or user commands. According to the conventional conversion operation, the shifting of fixed-point data, by one digit position to the left, and zero detection of the digit data to be shifted out are repeated. The number of continuous "zero" digits from the MSB of the fixed-point data (i.e., the number of leading "zero" digits) is thus obtained. An operation designated by software is performed by an ALU (arithmetic and logic unit) in accordance with the number of leading "zero" digits, thereby sequentially obtaining a mantissa part and an exponent part of floating-point data. By using the mantissa and exponent parts, normalized fixed-point data may be obtained.

However, according to the conventional converting means for obtaining fixed-point data by software, the shifting of digit position and zero detection must be performed repeatedly to determine the number of leading "zero" digits. The locations of the mantissa and exponent parts must be adjusted. For this reason, it is very difficult to convert fixed-point data to floating-point data, at a high rate of speed.

SUMMARY OF THE INVENTION

A primary object of the present invention is to provide a fixed-point data/floating-point data converting apparatus for simply creating a mantissa part and calculating an exponent part, so that high-speed conversion from fixed-point data to floating-point data may be performed with simple hardware.

To achieve the above object of the invention, a fixed-point data/floating-point data converting apparatus is provided, which comprises: a priority encoder for receiving signals which indicate whether or not the digits of the fixed-point data are "0", to thereby generate a number of continuous "zero" digits from the most significant digit of the fixed-point data, in accordance with the signals; a shifter for shifting the fixed-point data to the left by the number of continuous "zero" digits from said priority encoder, thereby obtaining a mantissa part; subtracting means for subtracting the number of continuous "zero" digits from a reference value, thereby obtaining an exponent part; and means for generating the floating-point data normalized in accordance with the subtraction results from said subtracting means, and a shifting results from said shifter.

DETAILED DESCRIPTION OF THE PREFERRED EMBODIMENTS

Figure 1:
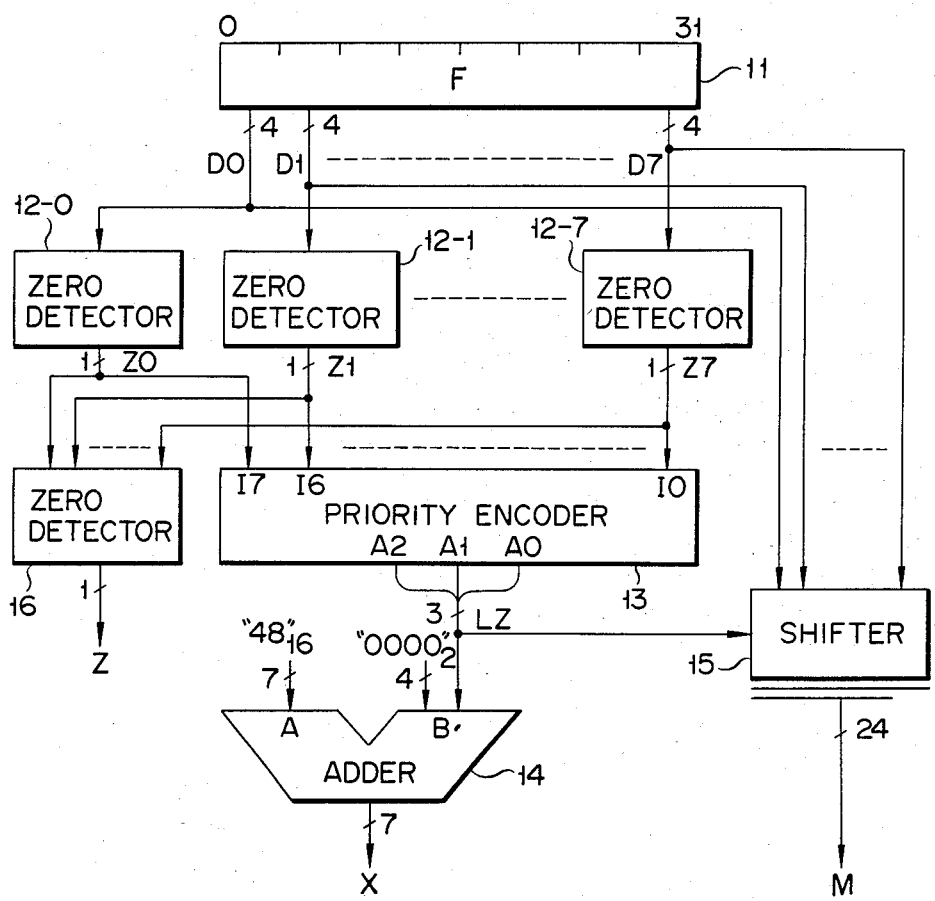
FIG. 1 is a block diagram of a fixed-point data/floating-point data converting apparatus according to an embodiment of the present invention.
Figure 2:
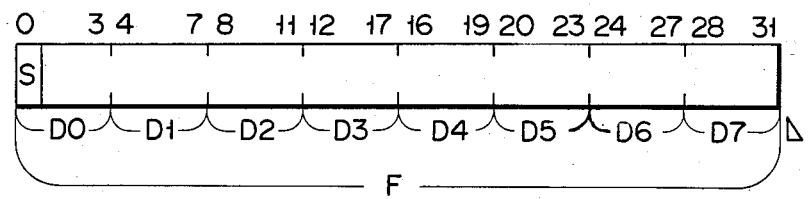
FIG. 2 shows a fixed-point data format used in the apparatus of FIG. 1.

FIG. 1 is a block diagram of a fixed-point data/floating-point data converting apparatus according to an embodiment of the present invention. In the apparatus shown in FIG. 1, the register 11 is a 32-bit register for storing fixed-point data F which is to be converted to floating-point data. The fixed-point data F used in this embodiment comprises hexadecimal 8-digit single precision (32-bit) data. FIG. 2 shows the data format of the fixed-point data F. The fixed-point data F comprises the 0th digit D0 (bit 0 to bit 3), the first digit D1 (bit 4 to bit 7), . . . , and the seventh digit D7 (bit 28 to bit 31). The most significant bit (bit 0) of the fixed-point data F serves as a sign bit S of the fixed-point data F. In general, when the bit S is set at logic level "0" (S="0"), this indicates that the fixed-point data is positive (or "zero"). However, when the bit S is set at logic level "1" (S="1"), this indicates that the fixed-point data F is negative. However, the fixed-point data F used in this embodiment is limited to that set to be positive or zero. Reference symbol Δ (FIG. 2) denotes a decimal point position.

The contents (digits D0 to D7) of the register 11 are supplied to zero detectors 12-0 to 12-7, in units of digits. The zero detectors 12-0 to 12-7 detect whether or not the digits D0 to D7 are hexadecimal "0", i.e., binary data "0000". In general, the zero detector 12-$i$ ($i$=0 to 7) generates a zero detection signal $Z_i$ of high logic level when digit $D_i$ is hexadecimal "0" (i.e., binary "0000"). Otherwise, the zero detector 12-$i$ generates a zero detection signal $Z_i$ of low logic level. The zero detector 12-$i$ preferably comprises a 4-input NOR gate.

The zero detection signals Z0 to Z7 from the zero detectors 12-0 to 12-7 are supplied to input terminals I7 to I0, respectively, of an 8-line-to-3-line priority encoder 13. The priority order assigned to the input terminals I7 to I0 is an order of I7, I6, . . . , and I0. The priority encoder 13 is active low. The priority encoder 13 encodes the number given to a terminal (highest priority terminal) which has the highest priority among the priorities of the terminals respectively receiving signals of low logic level. The encoded result appears at output terminals A2 (MSB), A1 and A0 (LSB). The priority encoder 13 preferably comprises an IC SN74148, which is manufactured by Texas Instruments, Inc. (U.S.A.).

Figures 3, 4, 5:
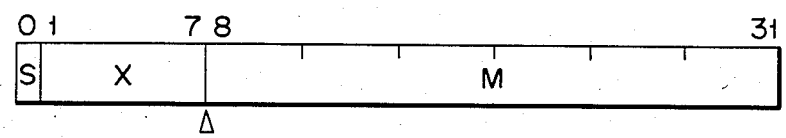
FIG. 3 is a table showing the relationship between input data and output data, with respect to the priority encoder shown in FIG. 1.
FIG. 4 shows the floating-point data format used in the apparatus shown in FIG. 1.
FIG. 5 is a table showing the relationship between the number of digits to be shifted (i.e., the output LZ from the priority encoder) and the results of left shifting.

FIG. 3 is a table showing the relationship between the input data (zero detection signals Z0 to Z7) and the output data (at terminals A2, A1 and A0) with respect to the priority encoder 13. Referring to FIG. 3, reference numeral H denotes a high logic level; L, a low logic level; and X, an irrelevant state. If the output data (A2, A1 and A0) shown in FIG. 3 is active high, the output data (A2, A1, A0) indicates the input terminal numbers having higher priority than the highest priority terminal described above. For example, assuming that the highest priority terminal given is the input terminal I5 (low level), the output data (A2, A1 and A0) from the priority encoder 13 is set to at the "LHL" level, as is apparent from FIG. 3. Therefore, when relationship wherein L="1" and H="0" are given (active low), the output data "LHL" ("101") would indicate the terminal number of the input terminal I5. If L ="0" and H="1" (active high), the output data (A2, A1, A0) from the priority encoder 13, will be "HLH" ("010" or $2_{16}$ in hexadecimal notation). This value indicates the numbers of terminals having higher priority than the highest priority terminal I5, i.e., the input terminals I6 and I7.

When the output data (A2, A1 and A0) from the priority encoder 13 is active high, it would indicate the number LZ (i.e., the number of leading "zero" digits) of continuous "zero" digits from the most significant digit. The leading "zero" digit number LZ of the fixed-point data F is obtained in accordance with the zero detection signals Z0 to Z7 from the zero detectors 12-0 to 12-7.

The output (LZ) from the priority encoder 13 is supplied, as a B-side source operand, to a 7-bit adder 14. The adder 14 also receives a reference value "48"$_{16}$ (with the subscript 16 indicating the hexadecimal notation) as the A-side source operand.

The reference value "48"$_{16}$ will be described hereinafter. The floating-point data generated from the apparatus of this embodiment comprises single precision (32-bit) data, just as in the same of fixed-point data. The format of the floating-point data is illustrated in FIG. 4. The floating-point data comprises a hexadecimal 6-digit (24-bit) mantissa part M (bit 8 to bit 31), a 7-bit exponent part X (bit 1 to bit 7), and a sign bit S (bit 0 or MSB). Reference symbol Δ in FIG. 4 denotes a decimal point position. In this embodiment, the hexadecimal numeric values fall within the range between "00"$_{16}$ and "7F"$_{16}$. The central value within this range is "40"$_{16}$. The value "40"$_{16}$ is used as the bias value in the exponential expression. In this case, the exponent part X is given as zero for X="40"$_{16}$. The exponent part X becomes positive for X≧"41"$_{16}$, and negative for X≦"39"$_{16}$. The maximum effective digit number of the fixed-point data F is 8. The digit number 8 is expressed as "8"$_{16}$ in hexadecimal notation. Therefore, when value "40"$_{16}$ is used as the bias value, the maximum value of the exponent part X becomes "48"$_{16}$. The maximum value "48"$_{16}$ of the exponent part X is given as the reference value described above.

Referring back to FIG. 1, the A-side source operand (i.e., reference value "48"$_{16}$) is subtracted from the B-side source operand (the number LZ of leading "zero" digits of the fixed-point data F). The subtraction results (7-bit data) obtained from the adder 14 comprises the exponent part X of the floating-point data to be obtained by the apparatus of this embodiment.

Outputs (digit data D0 to D7) from the register 11 are also supplied to a shifter 15 consisting of a combination of data selectors. The output (LZ) from the priority of encoder 13 is supplied to the shifter 15, as shift digit number designating data. The shifter 15 shifts the digit data D0 to D7 of the register 11 to the left by a number of digits represented by the output (LZ) supplied from the priority encoder 13 during one clock period. During shifting, "zero" data corresponding to the number of shift digits is input from the right to the shifter 15. As a result of shifting (32 bits) within the shifter 15, the upper 24 bits represent the mantissa part M of the floating-point data to be obtained by the apparatus of this embodiment.

The relationship between LZ and the result of left shifting is illustrated in FIG. 5.

As is apparent from the above description, according to this embodiment, the mantissa part M may be easily created and the exponent part X may be readily calculated, when simple hardware is added. Moreover, according to this embodiment, fixed-point data/floating-point data conversion may be performed at a high speed.

In the priority encoder 13 shown in FIG. 1, the number LZ of leading "zero" digits (LZ="8"$_{16}$) cannot be obtained when the digits of the fixed-point data F are hexadecimal "0", as may be seen from FIG. 3. When all of the digits of the fixed-point data F are hexadecimal "0", the mantissa part M and the exponent part X of the corresponding items of floating-point data are set at zero level, as well. Therefore, when all of the digits of the fixed-point data F are "0", the mantissa part M and the exponent part X of the corresponding floating-point data may be obtained independently of the shifter 15 and the adder 14. For this purpose, in this embodiment, the zero detection signals Z0 to Z7 from the zero detectors 12-0 to 12-7 are supplied to a zero detector 16. The zero detector 16 generates a zero detection signal Z of high logic level, which represents that all of the digits of the fixed-point data F are "0" (i.e., the number of leading "zero" digits is "8"$_{16}$) only when all of the zero detection signals Z0 to Z7 are at a high logic level. The zero detector 16 preferably comprises an 8-input AND gate. When a zero detection signal Z of a high logic level is generated from the zero detector 16, the mantissa part M and exponent part X of the corresponding floating-point data are set at the zero level, independently of the shifter 15 and the adder 14. This all-zero creation will be described in the following embodiment.

Figure 6:
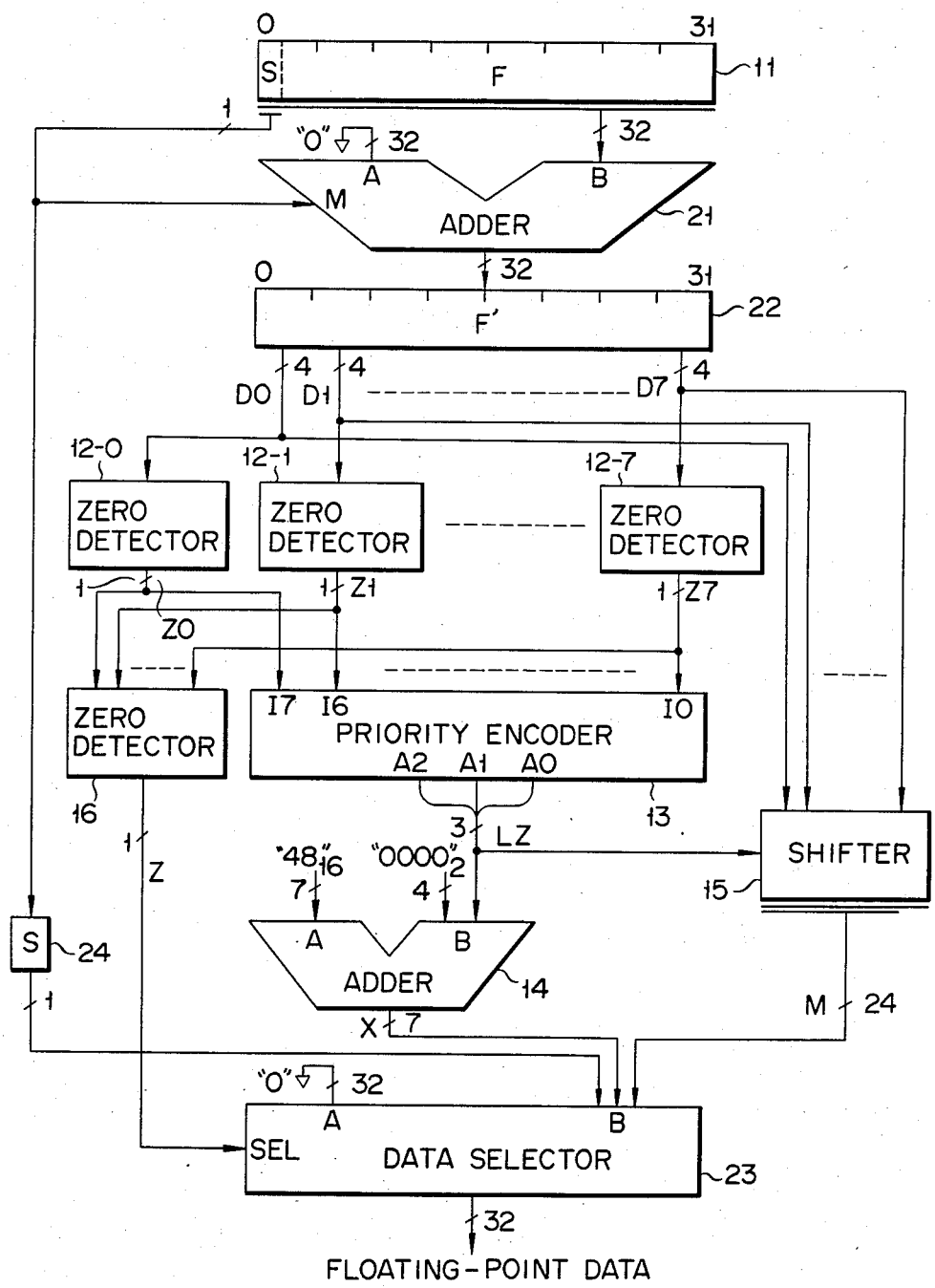
FIG. 6 is a block diagram of a fixed-point data/floating-point data converting apparatus according to another embodiment of the present invention.

FIG. 6 is a block diagram of a fixed-point data/floating-point data converting apparatus according to another embodiment of the present invention. The same reference numerals used in FIG. 1 denote the same parts in FIG. 6. In the apparatus shown in FIG. 6, it is possible to use negative fixed-point data F.

The embodiment of FIG. 6 is provided with a 32-bit adder 21. The adder 21 has A input terminals, B input terminals and a mode designating data input terminal M. The fixed-point data F transferred from the register 11 is supplied to the B input terminals, and all-zero 32-bit data is supplied to the A input terminals. The least significatnt bit of the register 11, i.e., the sign bit S of data F, is supplied to the terminal M. The adder 21 is set to be in the through mode when S="0" is set (i.e., when the fixed-point data F is positive or zero). Therefore, the adder 21 outputs, as fixed-point data F', the fixed-point data F from the register 11, without modification. However, the adder 21 is set in the subtraction mode when the relationship wherein S="1" is given (i.e., when the fixed-point data F is negative), so that the adder 21 subtracts the fixed-point data F supplied from the register 11 from the all-zero 32-bit data. Therefore, the negative fixed-point data F is converted to positive fixed-point data F'. When the fixed-point data F is a negative maximum value (i.e., when the MSB S is set at the "1" level, and bits 1 to 31 are all set at the "0" level), the subtraction results (data F') from the adder 21 correspond to data F. This result would indicate that negative/positive conversion cannot be performed by subtraction, by means of the adder 21, when the fixed-point data F is a negative maximum value. Therefore, fixed-point data F having a negative maximum value cannot be used in the apparatus of this embodiment.

The positive (or zero) fixed-point data F' is supplied from the adder 21 to a 32-bit register 22, and is loaded in at the register 22. The fixed-point data F' comprises the 5 digits D0 to D7 in the same manner as the fixed-point data F. Digits D0 to D7 from the register 22 is supplied to zero detectors 12-0 to 12-7 in units of digit data.

The zero detectors 12-0 to 12-7 detect whether or not all of the digits D0 to D7 are "0", and generate zero detection signals Z0 to Z7. Zero detection signals Z0 to Z7 are supplied to a priority encoder 13. The priority encoder 13 outputs data representing the number of leading "zero" digits, i.e., LZ, of the fixed-point data F', in accordance with the zero detection signals Z0 to Z7. The output (LZ) is supplied to the B input terminals of an adder 14. The reference value "48"$_{16}$ is supplied to the A input terminal of the adder 14. The adder 14 performs the subtraction of "48"$_{16}$−LZ, thereby obtaining the exponent part X (7 bit) of the floating-point data, just as in the case of the embodiment shown in FIG. 1.

The digits D0 to D7 from the register 22 is supplied to a shifter 15. The shifter 15 also receives as shift digit designation data the output (LZ) supplied from the priority encoder 13. As described above with reference to FIG. 1, the digits D0 to D7 from the register 22 are shifted to the left by the number of digits corresponding to the output (LZ) from the priority encoder 13 during one clock period. As a result of left shifting (32 bits) in the shifter 15, the upper 24 bits correspond to a mantissa part M of the fixed-point data.

The zero detection signals Z0 to Z7 from zero detectors 12-0 to 12-7 are supplied to zero detector 16. In the same manner as previously described, zero detector 16 generates a zero detection signal Z of a high logic level, which indicates the all-zero status (leading "zero" digit number LZ of "8"$_{16}$) of the fixed-point data F'. Zero detection signal Z is supplied to a select control terminal SEL of a data selector 23.

The sign bit S (MSB) of the fixed-point data F from the register 11 is supplied to a one-bit register 24. Linking data (32 bits) of an output (S) from the register 24, the output (X) from the adder 14 and the upper 24 bits (M) resulting from the shifting by the shifter 15 is supplied to B input terminals of the data selector 23. All-zero 32-bit. data is supplied to A input terminals of the data selector 23.

The data selector 23 selects A input data or B input data in accordance with the logic level of zero detection signal Z supplied to the select control signal terminal SEL. More particularly, when signal Z is at low logic level, it selects B input data. On the other hand, when signal Z is at high logic level, it selects A input data, i.e., all-zero 32-bit data. The output (32 bits) from the data selector 23 represents normalized floating-point data corresponding to fixed-point data F.

Figure 7:
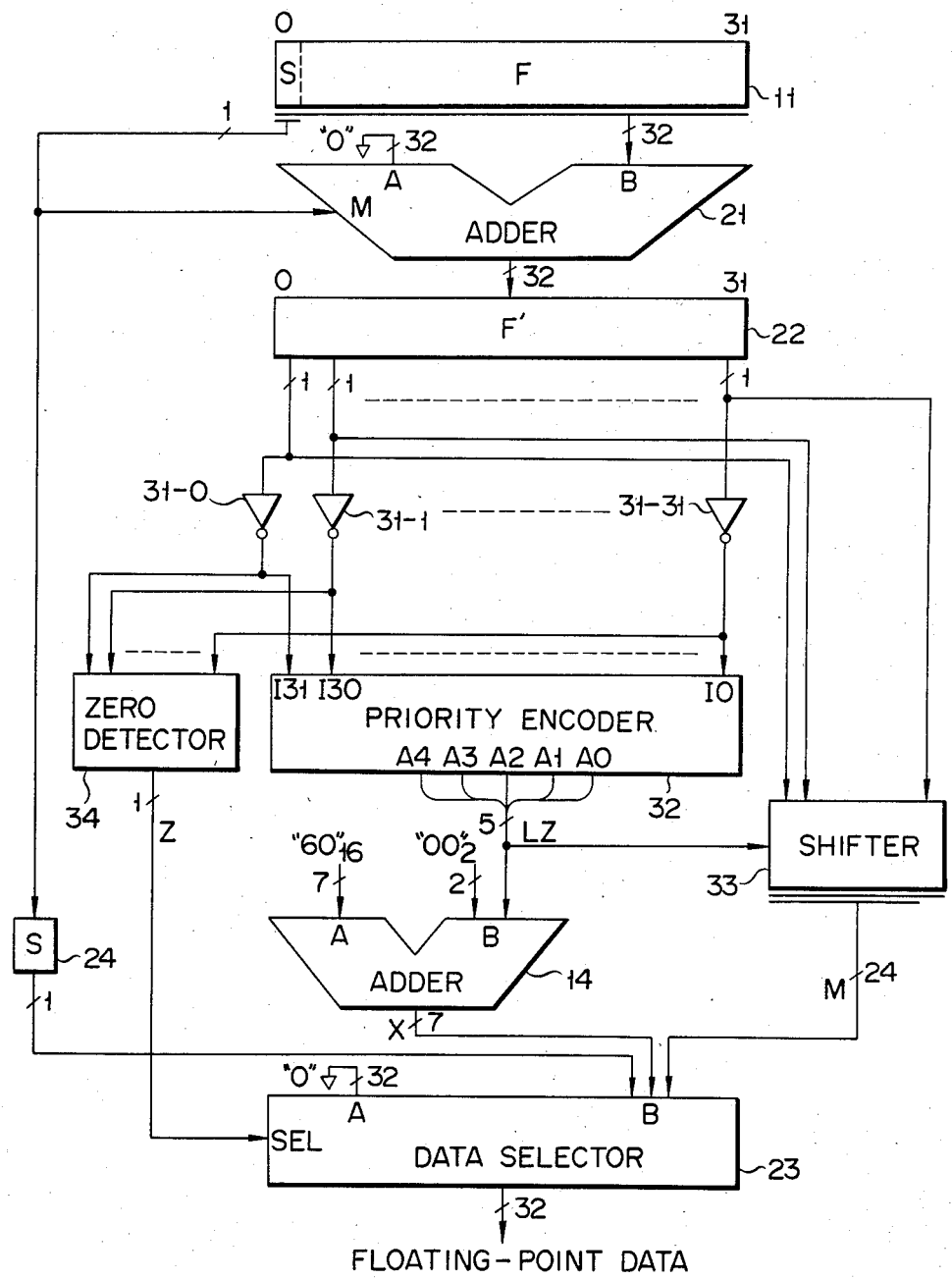
FIG. 7 is a block diagram of a fixed-point data/floating-point data converting apparatus according to still another embodiment of the present invention.

FIG. 7 is a block diagram of a fixed-point data/floating-point data converting apparatus according to still another embodiment of the present invention. The same reference numerals used in FIG. 6 denote the same parts in FIG. 7. The apparatus of FIG. 7 differs from that of FIG. 6, in that the hexadecimal 8-digit fixed-point data F (32 bits) is used in the apparatus of FIG. 6, whereas 32-bit fixed-point data is used in the apparatus of FIG. 7. The MSB (bit 0) of the 32-bit fixed-point data F is a sign bit S. In the apparatus shown in FIG. 7, when the fixed-point data F from a register 11 is positive or zero (S="0"), it is gated through an adder 21 in the same manner as described with reference to FIG. 6, and is loaded into a register 22. However, when the fixed-point data F from the register 11 is negative (S="1"), it is converted by the adder 21 to positive data. The converted data is supplied, as fixed-point data F', to the register 22.

The 32-bit fixed-point data F' is supplied from the register 22 to inverters 31-0 to 31-31, in units of bits. Outputs from inverters 31-0 to 31-31 are supplied to the input terminals I31 to I0 (of a 32-line-to-5-line priority encoder 32), respectively. The priority encoder 32 finds the number of LZ "zero" bits, in accordance with the outputs from the inverters 31-0 to 31-31. The priority encoder 32 comprises a combination of 8-line-to-3-line priority encoders of the same type as the priority encoder 13 of FIG. 1 or FIG. 6.

The output (LZ) from the priority encoder 32 is supplied to the B input terminals of the 7-bit adder 14. A reference value "60"$_{16}$ is supplied to the A input terminals of this adder 14. This reference value differs from the reference value "48"$_{16}$ which is used in the mbodiments of FIGS. 1 and 6. This is because the maximum umber of effective digits of the fixed-point data F is 32 ("20"$_{16}$ in hexadecimal), whereas that of the effecitve digits of data F is 8 ("8"$_{16}$ in hexadecil notation) in the embodiment of FIGS. 1 and 6. Hence, the bias value in exponential notation, "40"$_{16}$ is added to "20"$_{16}$, thus obtaining "60"$_{16}$. The bias value is the same as in the previous embodiments. The adder 14 subtracts the data LZ from "60"$_{16}$. The subtraction result (7 bits) from the adder 14 represents an exponent part X of the resultant floating-point data.

The fixed-point data F' from the register 22 is supplied to a shifter 33 which comprises data selectors. The shifter 33 receives, as shift bit number designation data, the output (LZ) supplied from the priority encoder 32. The 32-bit fixed-point data F' is shifted by the shifter 33 to the left, by the number of bits represented by the output (LZ) from the priority encoder 13 during one clock period. "Zero" bit data corresponding to the number of shift bits is input from the right into the shifter 33. The upper 24 bits of the resultant data represent a mantissa part M of the fixed-point data.

The outputs from the inverters 31-0 to 31-31 are also supplied to a zero detector 34. When all of the outputs from the inverters 31-0 to 31-31 are set at a high logic level, the zero detector 34 generates a zero detection signal Z a of high logic level which indicates that the fixed-point data F' is set in the all-zero status. The zero detection signal Z is supplied to a select control signal terminal SEL of a data selector 23. The all-zero 32 -bit data is supplied to A input terminals of the data selector 23. 32-bit linking data of the output (S) from the register 24 for storing the sign bit (S) data of the fixed-point data F, the 7-bit output (X) from the adder 14, and the upper 24 bits (M) resulting from the shifting by the shifter 33 is supplied to the B input terminals of the data selector 23. The data slector 23 selects the A input data or B input data in accordance with the logic level of the zero detection signal Z. More specifically, when the signal Z is set at a low logic level, the data selector 23 selects the B input data, (S+X+M). When the signal Z is set at a high logic level (i.e., the fixed-point data F' is set to be all "0"), the data selector 23 selects the A input data, all-zero 32-bit data. In this embodiment, the select output (32 bits) of the data selector 23 represents the normalized floating-point data corresponding to the 32-bit fixed-point data.

However, though the present invention is exemplified by the above embodiments, it is not limited thereto, since various changes and modifications may be made within its spirit and scope. For example, in the above embodiments, single precision (32-bit) data is used. However, the present invention may also be applied to a fixed-point data/floating-point data converting apparatus for converting double precision (64-bit) fixed-point data to the corresponding floating-point data. For example, the adder 14 and shifter 15 shown in FIG. 1 may be hardware specially designed for the apparatus of the present invention; or, they may be the floating-point data operation hardware provided in a data processor having a floating-point data operation function.

What is claimed is:

1. A fixed-point data/floating-point data converting apparatus comprising:
   a priority encoder, for respectively receiving signals which indicate whether or not the digits of a first fixed-point data are "0", to thereby generate a number of continuous "zero" digits from a most significant digit of the first fixed-point data, in accordance with the signals;
   a shifter for shifting the first fixed-point data to the left by the number of continuous "zero" digits from said priority encoder, thereby obtaining a mantissa part;
   subtracting means for subtracting the number of continuous "zero" digits from a reference value, thereby obtaining an exponent part; and
   means for generating floating-point data normalized in accordance with the mantissa part from said shifter and the exponent part from said subtracting means.

2. The apparatus according to claim 1, wherein the first fixed-point data is output data from converting means for performing one of two functions of supplying second fixed-point data and converting the same to a positive number, the second fixed-point data including a sign bit and being required to be converted to floating point data.

3. The apparatus according to claim 2, wherein said converting means comprises an adder which receives first all-zero data as a first source operand, second fixed-point data as a second source operand, and the sign bit of the second fixed-point data as an operation mode designation bit.

4. The apparatus according to claim 3, wherein said adder is set in a through mode when the sign bit is set at a logic level which indicates a positive number, and said adder is set in a subtraction mode when the sign bit is set at a logic level which indicates a negative number.

5. The apparatus according to claim 4, wherein said adder gates the second source operand as the first fixed-point data in the through mode.

6. The apparatus according to claim 4, wherein said adder subtracts the second source operand from the first source operand in the subtraction mode, and the results of subtraction are generated as the first fixed-point data.

7. The apparatus according to claim 1, wherein said floating-point data generating means generates the floating-point data in accordance with the sign bit of the second fixed-point data, second all-zero data, and a "zero" signal which indicates that the first fixed-point data is all-zero data.

8. The apparatus according to claim 7, wherein said floating-point data generating means selects as the floating-point data, one of the second all-zero data and data obtained by linking the sign bit of the second fixed-point data, the exponent part supplied from said subtracting means, and upper bits of resultant data from said shifter, in accordance with the "zero" signal.

9. The apparatus according to claim 8, wherein said floating-point data generating means comprises a data selector.

10. The apparatus according to claim 7, wherein the "zero" signal is an output signal which represents that all of the input signal supplied to said priority encoder are "0".

11. The apparatus according to claim 1, wherein the reference value is the sum of a central value within a possible exponent range and a maximum effective digit number of the first fixed-point data.

* * * * *